United States Patent
Choi et al.

(10) Patent No.: US 11,355,733 B2
(45) Date of Patent: Jun. 7, 2022

(54) OPTICAL FILM HAVING ANTISTATIC LAYERS, OPTICAL FILM MANUFACTURING METHOD, AND ORGANIC LIGHT-EMITTING ELECTRONIC DEVICE MANUFACTURING METHOD

(71) Applicant: LG CHEM, LTD., Seoul (KR)

(72) Inventors: Jeong Min Choi, Daejeon (KR); Jeehyon Min, Daejeon (KR); Hee Song, Daejeon (KR); Yoonkyung Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 132 days.

(21) Appl. No.: 16/757,170

(22) PCT Filed: Oct. 23, 2018

(86) PCT No.: PCT/KR2018/012566
§ 371 (c)(1),
(2) Date: Apr. 17, 2020

(87) PCT Pub. No.: WO2019/083255
PCT Pub. Date: May 2, 2019

(65) Prior Publication Data
US 2020/0343479 A1    Oct. 29, 2020

(30) Foreign Application Priority Data
Oct. 23, 2017    (KR) ........................ 10-2017-0137759

(51) Int. Cl.
*H01L 51/52*    (2006.01)
*H01L 51/56*    (2006.01)
*H01L 27/32*    (2006.01)

(52) U.S. Cl.
CPC ........ *H01L 51/5253* (2013.01); *H01L 27/323* (2013.01); *H01L 51/5246* (2013.01); *H01L 51/56* (2013.01)

(58) Field of Classification Search
CPC ... H01L 51/5253; H01L 27/323; H01L 51/56; H01L 51/5246
See application file for complete search history.

(56) References Cited

U.S. PATENT DOCUMENTS

| | | | |
|---|---|---|---|
| 8,164,715 B2 * | 4/2012 | Park | G02B 5/3033 |
| | | | 349/96 |
| 9,748,315 B2 | 8/2017 | Kim | |
| 2011/0310333 A1 * | 12/2011 | Kim | G02F 1/133528 |
| | | | 349/96 |
| 2014/0017967 A1 | 1/2014 | Kim et al. | |
| 2015/0205025 A1 * | 7/2015 | Park | G02F 1/133528 |
| | | | 349/96 |
| 2016/0159052 A1 | 6/2016 | Kim et al. | |
| 2016/0211049 A1 * | 7/2016 | Choi | H01B 1/24 |

(Continued)

FOREIGN PATENT DOCUMENTS

| | | |
|---|---|---|
| JP | 2008255345 A | 10/2008 |
| JP | 2008280520 A | 11/2008 |

(Continued)

*Primary Examiner* — Michael Jung
(74) *Attorney, Agent, or Firm* — Dentons US LLP (57) ABSTRACT

The present application relates to an optical film, a method for preparing an optical film, and a method for manufacturing an organic light emitting electronic device.

12 Claims, 2 Drawing Sheets

(56) References Cited

U.S. PATENT DOCUMENTS

| | | | |
|---|---|---|---|
| 2018/0212184 A1* | 7/2018 | Kondo | H01L 51/5234 |
| 2019/0310726 A1* | 10/2019 | Hashimoto | H01L 27/323 |

FOREIGN PATENT DOCUMENTS

| | | | |
|---|---|---|---|
| JP | 2010525960 A | 7/2010 | |
| JP | 2012251030 A | 12/2012 | |
| JP | 2014021498 A | 2/2014 | |
| JP | 2015-151429 A | 8/2015 | |
| JP | 2016-138237 A | 8/2016 | |
| JP | 2017039859 A | 2/2017 | |
| KR | 10-20000028755 A | 5/2000 | |
| KR | 10-20060009640 A | 2/2006 | |
| KR | 10-0810413 B1 | 3/2008 | |
| KR | 10-20100118430 A | 11/2010 | |
| KR | 10-1522822 B1 | 5/2015 | |
| KR | 10-20150101988 A | 9/2015 | |
| KR | 10-20160016267 A | 2/2016 | |
| KR | 10-20160067712 A | 6/2016 | |
| KR | 10-20160093422 A | 8/2016 | |
| KR | 10-20170022904 A | 3/2017 | |
| KR | 10-20170135512 A | 12/2017 | |
| WO | 2008140567 A2 | 11/2008 | |

\* cited by examiner

【FIG. 4】

OPTICAL FILM HAVING ANTISTATIC LAYERS, OPTICAL FILM MANUFACTURING METHOD, AND ORGANIC LIGHT-EMITTING ELECTRONIC DEVICE MANUFACTURING METHOD

The present application is a National Phase entry pursuant to 35 U.S.C. § 371 of International Application Mo. PCT/KR2018/012566 filed Oct. 23, 2018, and claims priority to and the benefit of Korean Patent Application No. 10-2017-0137759, filed with the Korean Intellectual Property Office on Oct. 23, 2017, the entire contents of which are incorporated herein by reference.

FIELD

The present disclosure relates to an optical film, a method for preparing the optical film, and a method for manufacturing an organic light emitting electronic device using the optical film.

BACKGROUND

An organic light emitting device is a self-emissive-type display device, and, unlike a liquid crystal display (LCD), may be manufactured to be light and thin since a separate light source is not required. In addition, an organic light emitting device is advantageous in terms of power consumption due to low voltage driving, and also has excellent response rate, viewing angle and contrast ratio, and has been studied as a next generation display.

The organic light emitting device has problems in that it is very vulnerable to impurities, oxygen and moisture, and thereby has its properties readily deteriorated by external exposure, or moisture or oxygen penetration, and its lifetime is shortened. In order to resolve such problems, an encapsulation layer for preventing oxygen, moisture or the like from being introduced into an organic light emitting device is required.

The encapsulation layer comprises a protective film for protecting the encapsulation layer after it is manufactured. Static electricity caused from high surface electrical resistance due to the material properties, common protective films have residues remaining in the encapsulation layer when peeling the protective film from the encapsulation layer. Foreign substances such as dirt or dust may adhere thereto causing damage to an organic light emitting device, and causing light emission defects in the organic light emitting device. In order to resolve such problems, a process of a worker removing static electricity one by one using a static electricity remover is required, which causes a problem of increasing production time and costs and thereby reducing productivity. Methods for resolving such problems have been required.

SUMMARY

The present disclosure relates to an optical film protecting a surface of an encapsulation layer in an organic light emitting electronic device and having an excellent antistatic function, a method for preparing the optical film, a method for protecting an encapsulation layer surface, and a method for manufacturing an organic light emitting electronic device.

One embodiment of the present disclosure provides an optical film comprising a base layer comprising a base film, a first antistatic layer and a second antistatic layer, each provided on opposing surfaces of the base film; and a protective layer comprising a protective film, a third antistatic layer and a fourth antistatic layer each provided on opposing surfaces of the protective film, and a release layer provided on a surface opposite to the surface facing the protective film of the third antistatic layer, wherein the base layer and the protective layer are bonded by an adhesive layer so that the second antistatic layer and the release layer face each other, surface resistance of the surface in contact with the release layer of the adhesive layer is greater than or equal to $10^9$ Ω/sq and less than or equal to $5\times10^{12}$ Ω/sq, and the adhesive layer has a relative dielectric constant of 3.5 or greater under 100 kHz.

Another embodiment of the present disclosure provides an optical film comprising a base layer comprising a base film, a first antistatic layer and a second antistatic layer each provided on opposing surfaces of the base film; and an adhesive layer provided on a surface opposite to the surface facing the base film of the second antistatic layer, wherein the adhesive layer has surface resistance of greater than or equal to $10^5$ Ω/sq and less than or equal to $5\times10^{12}$ Ω/sq, and the adhesive layer has a relative dielectric constant of 3.5 or greater under 100 kHz.

One embodiment of the present disclosure provides a method for preparing an optical film comprising forming a base layer comprising a base film, a first antistatic layer and a second antistatic layer provided on opposing surfaces of the base film; forming a protective layer comprising a protective film, a third antistatic layer and a fourth antistatic layer each provided on opposing surfaces of the protective film, and a release layer provided on a surface opposite to the surface facing the protective film of the third antistatic layer; and bonding the base layer and the protective layer by an adhesive layer so that the second antistatic layer and the release layer face each other, wherein surface resistance of the surface in contact with the release layer of the adhesive layer is greater than or equal to $10^9$ Ω/sq and less than or equal to $5\times10^{12}$ Ω/sq, and the adhesive layer has a relative dielectric constant of 3.5 or greater under 100 kHz.

Another embodiment of the present disclosure provides a method for manufacturing an organic light emitting electronic device comprising removing the protective layer from the above-described optical film; and attaching the adhesive layer of the optical film on an encapsulation layer of an organic light emitting device.

The present application provides an optical film having an excellent antistatic function, and thereby preventing foreign substances and device defects generated from static electricity when peeled from a device surface during an organic light emitting electronic device manufacturing process.

DETAILED DESCRIPTION

Hereinafter, the present specification will be described in more detail.

In the present specification, a description of a certain part "including" certain constituents means capable of further including other constituents, and does not exclude other constituents unless particularly stated on the contrary.

Embodiments of the present disclosure will be described in detail with reference to accompanying drawings so that those skilled in the art may readily implement the present disclosure. However, the present disclosure may be embodied in various different forms and is not limited to the embodiments described herein.

The present application relates to an optical film comprising a base layer; a protective layer; and an adhesive layer.

The base layer comprises a base film; and a first antistatic layer and a second antistatic layer each provided on both or opposing surfaces of the base film.

The protective layer comprises a protective film; a third antistatic layer and a fourth antistatic layer each provided on both or opposing surfaces of the protective film; and a release layer provided on a surface opposite to the surface facing the protective film of the third antistatic layer.

Figure 1:
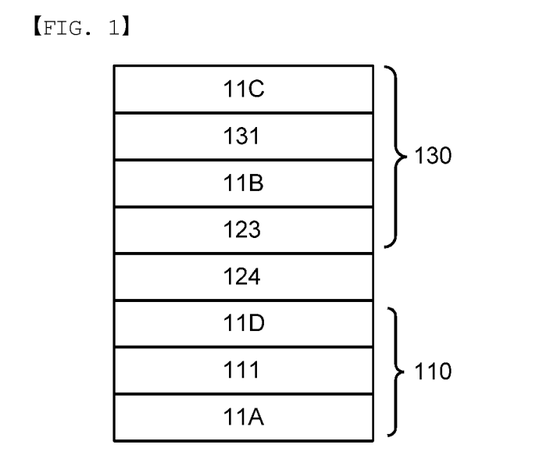
FIG. 1 is a schematic illustration of an optical film according to one embodiment.

Referring to FIG. 1, the optical film has a structure comprising a base layer (110) comprising a base film (111), and a first antistatic layer (11A) and a second antistatic layer (11D) each provided on both or opposing surfaces of the base film; a protective layer (130) comprising a protective film (131), a third antistatic layer (11B) and a fourth antistatic layer (11C) each provided on both or opposing surfaces of the protective film, and a release layer (123) provided on a surface opposite to the surface facing the protective film (131) of the third antistatic layer (11B); and the base layer (110) and the protective layer (130) are bonded by an adhesive layer (124) so that the second antistatic layer (11D) and the release layer (123) face each other.

In one embodiment, the optical film is a surface protective film capable of protecting a surface of an organic light emitting device during a process.

In one embodiment, the optical film may be used by attaching the adhesive layer on an adherend surface after removing the protective layer from the optical film.

Figure 2:
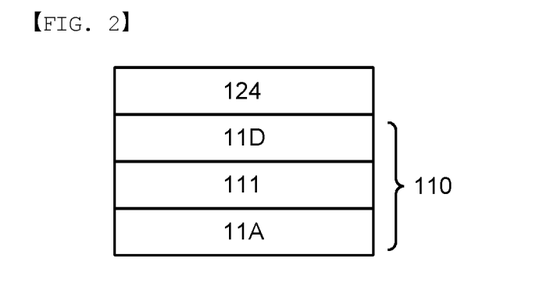
FIG. 2 is a schematic illustration of an optical film according to another embodiment.

When referring to FIG. 2, the protective layer-removed optical film comprises a base layer (110) comprising a base film (111), and a first antistatic layer (11A) and a second antistatic layer (11D) each provided on both surfaces of the base film; and an adhesive layer (124) provided on a surface opposite to the surface facing the base film (111) of the second antistatic layer (11D).

Figure 3:
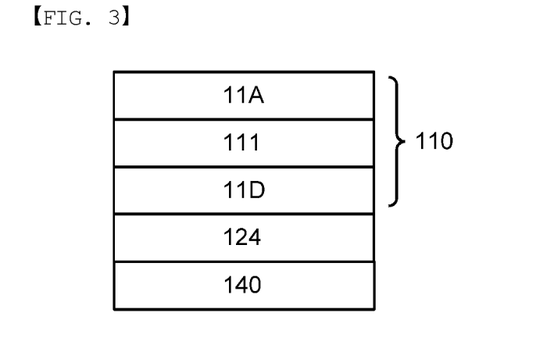
FIG. 3 is a schematic illustration of a form of an optical film of the present disclosure being attached on an adherend.

FIG. 3 illustrates a form of attaching the optical film of FIG. 2 on an adherend (140) surface to protect the adherend surface.

In the present specification, the adherend means a material to which the adhesive layer may adhere. In one embodiment, the adherend may mean an encapsulation layer of an organic light emitting device and a plastic substrate used in the device, but is not limited thereto.

In the optical film of the present disclosure, surface resistance of the surface in contact with the release layer of the adhesive layer is greater than or equal to $10^9$ Ω/sq and less than or equal to $5 \times 10^{12}$ Ω/sq, and the adhesive layer has a relative dielectric constant of 3.5 or greater under 100 kHz.

By the relative dielectric constant of the adhesive layer according to one embodiment of the present disclosure satisfying 3.5 or greater under 100 kHz, an excellent antistatic function is obtained, and, when peeling the adhesive layer from an adherend surface, contamination that may occur on the adherend surface due to static electricity, and product defects caused therefrom may be prevented.

In addition, when the adhesive layer has a relative dielectric constant in the above-mentioned range, an antistatic property of the second antistatic layer may be obtained on the adhesive layer surface even when the adhesive layer does not comprise a material that may exhibit an antistatic property such as an antistatic agent. This means that, when the adhesive layer is provided adjoining one surface of the base film instead of the second antistatic layer being provided on one surface of the base film in the present disclosure, surface resistance of the adhesive layer increases, and a target antistatic property of the present disclosure is not obtained in the adhesive layer. In one embodiment, the adhesive layer is in contact with the second antistatic layer.

In the present specification, a dielectric constant is a value indicating electrical properties of a nonconductor, and specifically, is a value indicating how weak an electric field has become based on an initial electric field. The degree of polarity of the nonconductor may be represented by the dielectric constant, and when polar with high polarity, the dielectric constant is measured to be high, and when nonpolar with low polarity, the dielectric constant is measured to be low.

In the present specification, a relative dielectric constant ($\varepsilon_r$) of the adhesive layer means a ratio of a dielectric constant ($\varepsilon$) of the adhesive layer with respect to a dielectric constant ($\varepsilon_0$) of vacuum.

In one embodiment, the adhesive layer may have a relative dielectric constant of 3.5 or greater; 4 or greater; 5 or greater; 6 or greater; or 7 or greater. As the adhesive layer has a higher relative dielectric constant, polarity in the adhesive layer increases, which readily offsets an external electric field. As the relative dielectric constant increases, an antistatic property of the adhesive layer may be enhanced.

In one embodiment, an upper limit of the relative dielectric constant of the adhesive layer is not limited. In one embodiment, the relative dielectric constant of the adhesive layer may be 10 or less considering the nature of the adhesive layer material.

The relative dielectric constant ($\varepsilon_r$) may be calculated by the following Mathematical Equation 1 after forming a Cu electrode having a diameter of 30 mm and a Cu electrode having a diameter of 30 mm on each of both surfaces of the adhesive layer, and measuring capacitance ($C_p$) at 25° C. and a frequency of 100 kHz using an impedance analyzer (impedance/gain-phase analyzer, HP 4194A), $$\varepsilon_r = \frac{C_p h}{A} \times \frac{1}{\varepsilon_0} \quad (\varepsilon_0 = 8.854 \times 10^{-12} \text{ F/m}) \quad \text{[Mathematical Equation 1]}$$

in Mathematical Equation 1, A is an area of the adhesive layer, and h is a thickness of the adhesive layer.

In one embodiment, surface resistance of the surface in contact with the release layer of the adhesive layer is greater than or equal to $10^9$ Ω/sq and less than or equal to $5 \times 10^{12}$ Ω/sq.

In one embodiment, surface resistance of the surface in contact with the release layer of the adhesive layer is an average value of three surface resistance values obtained by, cutting the optical film to have a width of 10 cm and a length of 10 cm, peeling the protective layer from the optical film, measuring the center of the adhesive layer; and measuring two points that are each 2.5 cm away from the center of the adhesive layer in a width direction of the adhesive layer for 10 seconds with an applying voltage of 100 V and a pressure of 2 kgf using a surface resistance measuring device (HIRESTA-UP MCP-HT450, Mitsubishi Chemical Corporation).

Types of the base film are not particularly limited. Examples of the base film may include a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acrylate film, an ethylene-propylene copolymer film, an ethylene-ethyl acrylate copolymer film, an ethylene-methyl acrylate copolymer film, a polyimide film or the like, but are not limited thereto. In one embodiment of the present disclosure, the base film may be a polyethylene terephthalate (PET) film.

The base film thickness may be properly selected considering purposes of the present application. For example, the base film thickness may be greater than or equal to 25 μm and less than or equal to 150 μm; greater than or equal to 50 μm and less than or equal to 125 μm; or greater than or equal to 50 μm and less than or equal to 100 μm. When bonding the optical film on an encapsulation layer of an organic light emitting device, the base film may be readily deformed when the base film range is less than the above-mentioned thickness range, and bonding defects may occur when the base film range is greater than the above-mentioned thickness range.

On the base film, a proper adhesion treatment such as a corona discharge treatment, an ultraviolet irradiation treatment, a plasma treatment or a sputter etching treatment may be performed, however, the treatment is not limited thereto.

In one embodiment, the base film may be directly attached to the first and/or the second antistatic layers. In another embodiment, when the base film is surface treated, the first and/or the second antistatic layers may be attached to the surface-treated base film.

The term "antistatic layer" in the present specification means a layer intending to suppress static electricity generation.

The first to the fourth antistatic layers may be formed using known methods to accomplish target effects. For example, the first to the fourth antistatic layers may be formed on both or opposing surfaces of the base film and both or opposing surfaces of the protective film using an inline coating method. The inline coating method is a method of monoaxially orienting an extruded film, coating a coating layer thereon, and then completing the film through biaxial orientation. In the inline coating method, coating is performed during a film preparation process, and therefore, adhesion between the coating layer and the film increases, and the coating layer is continuously provided with the film preparation shortening the process, and the film may be prepared to be as thin as possible.

In the present disclosure, the first to the fourth antistatic layers may be formed to a proper antistatic composition considering purposes of the present application. For example, the first to the fourth antistatic layers may include a thermocurable binder resin in a range not affecting effects of the present disclosure.

In the present specification, the term 'thermocurable binder resin' means a binder resin that may be cured through a proper heat-applying or aging process. For example, as the thermocurable binder resin, one selected from the group consisting of an acryl-based resin, an urethane-based resin, a urethane-acryl-based copolymer, an ester-based resin, an ether-based resin, an amide-based resin, an epoxy-based resin and a melamine resin, or a mixture thereof may be used, however, the thermocurable binder resin is not limited thereto.

In one example, the first to the fourth antistatic layers may comprise a conductive material. The conductive material may include a conductive polymer or a carbon nanotube, but is not limited thereto.

The conductive polymer may be formed with, for example, polyaniline, polypyrrole, polythiophene series, derivatives and copolymers thereof, but is not limited thereto.

Carbon nanotubes may have a tubular shape formed by rounding a graphite plate formed by connecting a hexagonal ring formed with 6 carbons. Carbon nanotubes have excellent rigidity and electrical conductivity, and when used as an antistatic layer of an optical film, hardness of the antistatic layer may increase, and an antistatic function may be enhanced.

The thicknesses of the first to the fourth antistatic layers may be properly selected considering purposes of the present application, and the thickness of each of the antistatic layers may be the same as or different from each other.

In one embodiment, the thicknesses of the first to the fourth antistatic layers may be each independently greater than or equal to 10 nm and less than 400 nm; preferably greater than or equal to 20 nm and less than or equal to 300 nm; or greater than or equal to 20 nm and less than or equal to 100 nm. By the first to the fourth antistatic layers having thicknesses in the above-described range, excellent coatability may be obtained on both surfaces of the base film or both surfaces of the protective film.

In one embodiment, surface resistance of the first to the fourth antistatic layers may be properly selected considering purposes of the present application. For example, surface resistance of the first to the fourth antistatic layers may be each independently $10^3$ Ω/sq or greater; $10^6$ Ω/sq or greater; $10^7$ Ω/sq or greater; $10^8$ Ω/sq or greater; or $10^9$ Ω/sq or greater. For example, surface resistance of the first to the fourth antistatic layers may be each independently $5\times10^{12}$ Ω/sq or less; or $10^{11}$ Ω/sq or less. When the first to the fourth antistatic layers have surface resistance in the above-described range, the optical film may have an excellent antistatic function.

In one embodiment, the first and the second antistatic layers are each provided on both or opposing surfaces of the base film. In one embodiment, the first and the second antistatic layers are each in direct contact with both or opposing surfaces of the base film. In the present disclosure, the third and the fourth antistatic layers are each provided on both or opposing surfaces of the protective film. In one embodiment, the third and the fourth antistatic layers are each in direct contact with both or opposing surfaces of the protective film.

In one embodiment, the adhesive layer is in direct contact with the second antistatic layer and the release layer.

In one embodiment, the adhesive layer may be a non-silicone-based adhesive layer. The non-silicone-based adhesive layer may be, for example, a rubber-based adhesive layer, a urethane-based adhesive layer or an acryl-based adhesive layer, but is not limited thereto. Particularly, when the adhesive layer is a non-silicone-based adhesive layer, the release layer and the adhesive layer may be separated without generating residual images on the adhesive layer even with low peel strength.

In one embodiment, the adhesive layer may be a urethane-based adhesive layer. When the adhesive layer includes a urethane polymer, the adhesive layer has a higher relative dielectric constant, and an antistatic property of the second antistatic layer may be more favorably obtained on the adhesive layer.

As the rubber-based adhesive layer, adhesive layers including natural rubber, polyisoprene rubber, polyisobutylene rubber, polybutadiene rubber, a styrene-butadiene-styrene block copolymer or the like may be used.

The acryl-based adhesive layer may include a (meth) acrylic acid ester monomer. The monomer may be included in a polymer as a polymerization unit. The monomer being included in a polymer as a polymerization unit in the present specification may mean the monomer forming, after going through a polymerization reaction and the like, a skeleton of the polymer, for example, a main chain or a side chain thereof.

As the (meth)acrylic acid ester monomer, an alkyl (meth) acrylate may be used as an example. In one embodiment, considering cohesion, a glass transition temperature or the like of the adhesive, the alkyl group of the alkyl (meth) acrylate may have 1 to 14 carbon atoms. As the alkyl (meth)acrylate, methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth) acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate, tetradecyl (meth)acrylate and the like may be used, however, the alkyl (meth)acrylate is not limited thereto. One, two or more types may be used as the alkyl (meth) acrylate, and the monomer mixing ratio may be properly selected considering adhesive strength of the adhesive layer.

The acryl-based adhesive layer may further include an elastomer. Examples of the elastomer may include one, two or more types selected from the group consisting of natural isoprene, synthetic polyisoprene, polybutadiene, chloroprene rubber, butyl rubber, halogenated butyl rubber, styrene-butadiene rubber, nitrile rubber and hydrogenated nitrile rubber.

The urethane-based adhesive layer means an adhesive layer including a polyurethane-based resin. The polyurethane resin means a resin obtained by curing a composition containing a polyol and a multifunctional isocyanate compound. The urethane-based adhesive layer may be obtained from a cured material of a composition containing one or more groups selected from the group consisting of, for example, a hydroxyl group, an amine group and a carboxyl group.

The polyol may contain, for example, polyester polyol, polyether polyol, polycaprolactone polyol or polycarbonate polyol, but is not limited thereto. Examples of the polyol component may include ethylene, glycol, diethylene glycol, polypropylene glycol and the like, but are not limited thereto.

As the multifunctional isocyanate compound, any suitable multifunctional isocyanate compound that may be used in a urethanization reaction may be employed. Examples of such a multifunctional isocyanate compound may include multifunctional aliphatic-based isocyanate compounds, multifunctional alicyclic-based isocyanate, multifunctional aromatic-based isocyanate compounds, and the like.

The adhesive layer may be formed by curing an adhesive composition, however, a method of curing the adhesive composition is not particularly limited, and, for example, a method of curing through proper drying, heating and/or aging; or curing by irradiation of electromagnetic waves such as ultraviolet (UV) rays may be employed.

A composition of the adhesive composition forming the adhesive layer may be properly selected considering purposes of the present application. For example, the adhesive composition may include an adhesive resin, a curing agent, a plasticizer, a photoinitiator, a solvent, a hydrolysis inhibitor, an antioxidant, a curing accelerator, an anti-retardant and the like.

In the present disclosure, the adhesive layer thickness may be properly selected considering purposes of the present application. For example, the adhesive layer thickness may be 10 µm or greater; 30 µm or greater; or 45 µm or greater. For example, the adhesive layer thickness may be 200 µm or less; 150 µm or less; 100 µm or less; or 90 µm or less.

By employing the thickness of the adhesive layer in the above-mentioned range, adhesion and wetting of the adhesive layer for an adherend surface may be enhanced.

In the present disclosure, a metal ion content in the adhesive layer is 50 ppm or less, preferably 40 ppm or less, more preferably 30 ppm or less, and particularly preferably 20 ppm or less. The metal ion means an alkali metal (group 1) such as a lithium ion, a sodium ion or a potassium ion. The metal ion content in the adhesive layer means a content of metal ions included in the adhesive layer with respect to a total weight of the adhesive layer.

In the present disclosure, a metal ion content in the adhesive layer being 50 ppm or less means that an antistatic agent is not included in the adhesive layer. The optical film of the present disclosure may have an antistatic property even when an antistatic agent is not included in the adhesive layer.

In the present specification, 'glass' may mean alkali-free glass (NEG Co., Ltd., OA-21), unless particularly limited.

In the present disclosure, peel strength of the adhesive layer for glass measured at a peel angle of 180° and a peel rate of 0.3 m/min may be greater than or equal to 0.5 gf/in and less than or equal to 15 gf/in; greater than or equal to 0.5 gf/in and less than or equal to 13 gf/in; or greater than or equal to 0.5 gf/in and less than or equal to 10 gf/in.

In one embodiment, peel strength of the adhesive layer for glass is peel strength measured when peeling the protective layer from the optical film, cutting the optical film to have a width of 2.54 mm and a length of 250 mm, then attaching the adhesive layer of the optical film to glass using a 2 kg roller, and storing the result for 24 hours under a temperature of 25° C. and relative humidity of 50%, and then peeling the optical film from the glass at a peel rate of 0.3 m/min and a peel angle of 180° using a material property analyzer (texture analyzer, manufactured by Stable Micro Systems of England).

In one embodiment, the peel strength when peeling the optical film from the glass at a peel rate of 0.3 m/min and a peel angle of 180° is a value measured under a temperature of 25° C. and relative humidity of 50%.

In the present specification, wetting or wetting time means a time taken for the adhesive to be wetted for the whole adherend surface, and as a method of measuring the wetting, methods generally used in the art may be used. For example, a method of evaluating wetting of the experimental example to describe later may be used for the measurement.

The adhesive layer may have a wetting time of 0.5 seconds to 6 seconds; 0.5 seconds to 5 seconds; or 1 second to 5 seconds for glass. By the adhesive layer having a wetting time in the above-described range, the adhesive layer and the release layer may be separated without generating residual images on the adhesive layer surface.

The adhesive layer of the present disclosure according to one embodiment is provided on one surface of the second antistatic layer, and decreases cumulative electrostatic capacity. In addition, static electricity is generated less on the adhesive layer surface when peeling the protective layer from the optical film since surface resistance of the adhesive layer decreases.

In the present disclosure, the protective layer comprises a protective film; a third antistatic layer and a fourth antistatic layer each provided on both or opposing surfaces of the protective film. On a surface opposite to the surface facing the protective film of the third antistatic layer, a release layer is provided.

Examples of the protective film may include one or more selected from the group consisting of polyethylene terephthalate; polytetrafluoroethylene; polyethylene; polypropylene; polybutene; polybutadiene; a vinyl chloride copolymer; polyurethane; ethylene-vinyl acrylate; an ethylene-propylene copolymer; an ethylene-ethyl acrylate copolymer; an ethylene-methyl acrylate copolymer; polyimide; nylon; a styrene-based resin or elastomer; a polyolefin-based resin or elastomer; other elastomers; a polyoxyalkylene-based resin or elastomer; a polyester-based resin or elastomer; a polyvinyl chloride-based resin or elastomer; a polycarbonate-based resin or elastomer; a polyphenylene sulfide-based resin or elastomer; mixtures of hydrocarbon; a polyamide-based resin or elastomer; an acrylate-based resin or elastomer; an epoxy-based resin or elastomer; a silicone-based resin or elastomer; and a liquid crystal polymer, but are not limited thereto.

The protective film thickness may be properly selected considering purposes of the present application. For example, the thickness may be greater than or equal to 25 μm and less than or equal to 150 μm; greater than or equal to 25 μm and less than or equal to 125 μm; or greater than or equal to 25 μm and less than or equal to 100 μm. When the protective film thickness is less than the above-mentioned range, the protective film may be readily deformed when bonding the adhesive layer-formed optical film to an encapsulation layer of an organic light emitting device, and bonding defects may occur when the protective film thickness is greater than the above-mentioned range.

A material of the release layer may be properly selected depending on purposes of the present disclosure. As the release layer, general polymer films in the field of the present disclosure may be used, and for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acrylate film, an ethylene-propylene copolymer film, an ethylene-ethyl acrylate copolymer film, an ethylene-methyl acrylate copolymer film, a polyimide film or the like may be used, however, the release layer is not limited thereto.

The release layer thickness may be properly selected considering purposes of the present application. For example, the release layer thickness may be greater than or equal to 10 nm and less than or equal to 500 nm; greater than or equal to 10 nm and less than or equal to 300 nm; or greater than or equal to 10 nm and less than or equal to 200 nm. When the release layer does not have the above-described thickness, film defects may occur during a process, and therefore, having the above-mentioned thickness is preferred.

One embodiment of the present specification provides a method for preparing an optical film. The preparation method may relate to, for example, a method for preparing the optical film described above. Accordingly, descriptions on the optical film provided above may be applied to an optical film formed using the method for preparing an optical film to describe below in the same manner.

In one example, the method for preparing an optical film may comprise forming a base layer comprising a base film, a first antistatic layer and a second antistatic layer provided on both or opposing surfaces of the base film; forming a protective layer comprising a protective film, a third antistatic layer and a fourth antistatic layer each provided on both or opposing surfaces of the protective film, and a release layer provided on a surface opposite to the surface facing the protective film of the third antistatic layer; and bonding the base layer and the protective layer by an adhesive layer so that the second antistatic layer and the release layer face each other.

In the method for preparing an optical film, surface resistance of the surface in contact with the release layer of the adhesive layer is greater than or equal to $10^9$ Ω/sq and less than or equal to $5 \times 10^{12}$ Ω/sq, and the adhesive layer has a relative dielectric constant of 3.5 or greater under 100 kHz.

In one embodiment, the optical film comprising a base layer comprising a base film, a first antistatic layer and a second antistatic layer provided on both or opposing surfaces of the base film; and an adhesive layer provided on a surface opposite to the surface facing the base film of the second antistatic layer may be prepared by peeling the protective layer in the optical film comprising the protective layer and the release layer described above.

One embodiment of the present specification provides a method for manufacturing an organic light emitting electronic device.

In one example, the method for manufacturing an organic light emitting electronic device may comprise removing the protective layer from the optical film described above; and attaching the adhesive layer of the optical film on an encapsulation layer of an organic light emitting device.

In another example, the organic light emitting device may consecutively comprise a back plate, a plastic substrate, a thin film transistor, an organic light emitting diode and an encapsulation layer.

Figure 4:
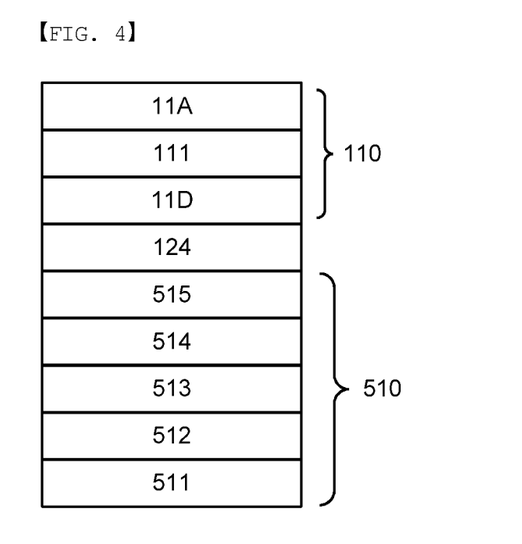
FIG. 4 is a schematic illustration of a state in which an adhesive layer is attached on an encapsulation layer during an organic light emitting electronic device manufacturing process.

FIG. 4 is a diagram illustrating a state in which the optical film according to one embodiment of the present disclosure is attached on the encapsulation layer during an organic light emitting electronic device manufacturing process. When referring to FIG. 4, the optical film of FIG. 2 according to one embodiment of the present disclosure is attached on an encapsulation layer (515) of an organic light emitting device (510) consecutively comprising a back plate (511), a plastic substrate (512), a thin film transistor (513), an organic light emitting diode (514) and the encapsulation layer (515) so that the adhesive layer and the encapsulation layer face each other.

The encapsulation layer may exhibit excellent moisture barrier properties and optical properties in the organic light emitting electronic device. In addition, the encapsulation layer may be formed to a stable encapsulation layer regardless of an organic light emitting electronic device type such as top emission or bottom emission.

In one embodiment, the encapsulation layer may include a single layer or multilayer inorganic material layer. When the inorganic material layer is a multilayer, a first inorganic material layer, an organic material layer and a second inorganic material layer may be consecutively included. The single layer or multilayer inorganic material layer may be included in an outermost layer of the encapsulation layer. As a method of forming the encapsulation layer, common methods of forming an encapsulation layer known in the art may be used. In one example, an adhesive layer may be directly attached on a surface on which the organic material layer is not formed of the second inorganic material layer.

Examples of the single layer or multilayer inorganic material layer may include aluminum oxide-based, silicon nitride-based, silicon oxynitride-based and the like. The organic material layer is introduced between the first and the second inorganic material layers, and may perform a function of relieving stress of the inorganic material layer while planarizing the irregular surface caused by inorganic particles and the like. Examples of the organic material layer may include an acrylate resin, an epoxy resin or the like.

The method for manufacturing an organic light emitting electronic device of the present application may further comprise peeling the optical film from the encapsulation layer; and laminating a touch screen panel and a cover window on the encapsulation layer. When peeling the optical film from the encapsulation layer, an excellent antistatic function is obtained in the encapsulation layer, and therefore, device defects may be prevented by preventing foreign substances from being attached between the encapsulation layer and the touch screen when bonding the touch screen panel on the encapsulation layer.

Hereinafter, the present application will be described in more detail with reference to examples that follow the present application and a comparative example that does not follow the present application, however, the scope of the present application is not limited to the examples provided below.

EXAMPLES

<Preparation of Optical Film>

Example 1

A film (H33P-both surfaces, Kolon) having a thickness of 75 μm in which both surfaces of polyethylene terephthalate (PET) are coated with a first antistatic layer and a second antistatic layer was prepared as a base layer.

Subsequently, 93 parts by weight of ethylhexyl acrylate (EHA) and 7 parts by weight of hydroxyethyl acrylate (HEA) were mixed to polymerize an acryl-based adhesive resin, and a coating solution adding an isocyanate curing agent in 5 parts by weight with respect to 100 parts by weight of the acryl-based adhesive resin was coated on the second antistatic layer, and the result was dried and aged to prepare an acryl-based adhesive layer having a thickness of 30 μm.

Next, a protective layer (12ASW, SKC) having a thickness of 50 μm in which a third antistatic layer and a fourth antistatic layer are formed on both surfaces of a polyethylene terephthalate (PET) film (XD510P, TAK Inc.), and a release layer is coated on the third antistatic layer was laminated thereon so that the release layer is located on the adhesive layer, and an optical film was prepared.

Example 2

An optical film was prepared in the same manner as in Example 1 except that, instead of the acryl-based adhesive resin, a urethane-based adhesive resin (UA-4, Samhwa Paints Industrial Co., Ltd.) was used and the urethane-based adhesive layer was prepared to a thickness of 50 μm.

Example 3

An optical film was prepared in the same manner as in Example 1 except that, instead of the acryl-based adhesive resin, a urethane-based adhesive resin (UA-4, Samhwa Paints Industrial Co., Ltd.) was used and the urethane-based adhesive layer was prepared to a thickness of 75 μm.

Comparative Example 1

An optical film was prepared in the same manner as in Example 1 except that, instead of the base layer of Example 1, a film (H33P-one surface, Kolon) in which one surface of polyethylene terephthalate (PET) is coated with a first antistatic layer was used as the base layer, and the coating solution was formed on the base film of the base layer.

Comparative Example 2

An optical film was prepared in the same manner as in Example 3 except that, instead of the base layer of Example 3, a film (H33P-one surface, Kolon) in which one surface of polyethylene terephthalate (PET) is coated with a first antistatic layer was used as the base layer, and the coating solution was formed on the base film of the base layer.

Comparative Example 3

An optical film was prepared in the same manner as in Example 1 except that, instead of the acryl-based adhesive layer of Example 1, an acryl-based adhesive layer having a thickness of 35 μm prepared by mixing 60 parts by weight of n-butyl acrylate (BA), 30 parts by weight of methyl methacrylate (MMA) and 10 parts by weight of 4-hydroxybutyl acrylate (4-HBA) to polymerize an acryl-based adhesive resin having a molecular weight of 1,500,000 g/mol, coating a coating solution adding a curing agent (TKA-100, Asahi kasei Corporation) in 30 parts by weight and isopropyl myristate (IPMS) in 100 parts by weight with respect to 100 parts by weight of the acryl-based adhesive resin on the second antistatic layer, and then drying and aging the result was used.

Properties of the examples and the comparative examples were evaluated as follows.

<Evaluation on Relative Dielectric Constant>

On both surfaces of each of the adhesive layers of Examples 1 to 3 and Comparative Examples 1 to 3, a Cu electrode having a diameter of 30 mm and a Cu electrode having a diameter of 30 mm were each formed. After measuring capacitance ($C_p$) under a frequency of 100 kHz at a temperature of 25° C. using an impedance analyzer (impedance/gain-phase analyzer, HP 4194A), a relative dielectric constant ($\varepsilon_r$) was calculated considering a thickness and an area of the adhesive layer. As the equation, the following formula may be used.

$$\varepsilon_r = \frac{C_p h}{A} \times \frac{1}{\varepsilon_0} \quad (\varepsilon_0 = 8.854 \times 10^{-12} \text{ F/m})$$

(A: area of adhesive layer, h: thickness of adhesive layer)

<Evaluation on Surface Resistance>

A specimen was prepared by cutting each of the optical films of Examples 1 to 3 and Comparative Examples 1 to 3 to have a width of 10 cm and a length of 10 cm. After peeling the protective layer from the optical film, surface resistance of the adhesive layer was measured by, using a surface resistance measuring device (HIRESTA-UP MCP-HT450, Mitsubishi Chemical Corporation), pressing an electrode of the measuring device with a pressure of 2 kgf, and applying a voltage of 100 V at a temperature of 25° C. The center of the adhesive layer; and two points that are each 2.5 cm away from the center of the adhesive layer in a width direction of the adhesive layer were measured for 10 seconds, and an average value of the three was taken.

<Evaluation on Peel Strength>

A specimen was prepared by cutting each of the optical films of Examples 1 to 3 to have a width of 2.54 mm and a length of 250 mm. After peeling the protective layer from the optical film, the adhesive layer of the optical film was attached to glass using a 2 kg roller, and the result was stored for 24 hours at 25° C. Then, peel strength was evaluated while peeling the optical film from the glass at a peel rate of 0.3 m/min and a peel angle of 180° at a temperature of 25° C. using an apparatus (texture analyzer, manufactured by Stable Micro Systems of England).

<Evaluation on Wetting>

After cutting each of the optical films of Examples 1 to 3 and Comparative Examples 1 and 2 to have a width of 50 mm and a length of 150 mm, the protective layer was peeled from the optical film, and the optical film was attached to glass using a 2 kg roller, and time taken for the whole adhesive layer to be wetted on the glass was measured.

Results of evaluating properties of the optical films prepared in Examples 1 to 3 and Comparative Examples 1 to 3 are as shown in the following Table 1 to Table 3.

TABLE 1

| Category | Second Anti-static Layer | Adhesive Resin | Thickness (μm) | Relative Dielectric Constant | Adhesive Layer Surface Resistance (Ω/sq) |
|---|---|---|---|---|---|
| Example 1 | O | Acryl | 30 | 3.8 | $2.2 \times 10^{12}$ |
| Example 2 | O | Urethane | 50 | 6.4 | $5.2 \times 10^{10}$ |
| Example 3 | O | Urethane | 75 | 7.2 | $4.6 \times 10^{9}$ |
| Comparative Example 1 | X | Acryl | 30 | 2.8 | Over |
| Comparative Example 2 | X | Urethane | 75 | 3.2 | Over |
| Comparative Example 3 | O | Acryl | 35 | 2.5 | Over |

In Table 1, over means the adhesive layer having surface resistance of greater than $10^{13}$ Ω/sq.

TABLE 2

| Category | Adhesive Resin | Thickness (μm) | Wetting Time (s) |
|---|---|---|---|
| Example 1 | Acryl | 30 | 4 |
| Example 2 | Urethane | 50 | 5 |
| Example 3 | Urethane | 75 | 4 |
| Comparative Example 1 | Acryl | 30 | 10 |
| Comparative Example 2 | Urethane | 75 | 7 |

TABLE 3

| Category | Adhesive Resin | Thickness (μm) | Peel Strength for Glass (gf/in) |
|---|---|---|---|
| Example 1 | Acryl | 30 | 9 |
| Example 2 | Urethane | 50 | 5 |
| Example 3 | Urethane | 75 | 4 |

As shown in Table 1, it was seen that the optical films of Examples 1 to 3 had lower adhesive layer surface resistance values compared to the optical films of Comparative Examples 1 to 3. Having lower surface resistance means suppression of static electricity generation, and it was seen that, when using the adhesive layer having a relative dielectric constant of 3.5 or greater, an effect of preventing attachment of foreign substances caused by static electricity generation is excellent in a device when manufacturing an organic light emitting electronic device.

REFERENCE NUMERAL

11A: First Antistatic Layer
11B: Third Antistatic Layer
11C: Fourth Antistatic Layer
11D: Second Antistatic Layer
110: Base Layer
111: Base Film
123: Release Layer
124: Adhesive Layer
130: Protective Layer
131: Protective Film
140: Adherend
510: Organic Light Emitting Device
511: Back Plate
512: Plastic Substrate
513: Thin Film Transistor
514: Organic Light Emitting Diode
515: Encapsulation Layer

The invention claimed is:

1. An optical film comprising:
a base layer comprising a base film, a first antistatic layer and a second antistatic layer each provided on opposing surfaces of the base film; and
a protective layer comprising a protective film, a third antistatic layer and a fourth antistatic layer each provided on opposing surfaces of the protective film, and
a release layer provided on a surface opposite to the surface facing the protective film of the third antistatic layer,
wherein the base layer and the protective layer are bonded by an adhesive layer so that the second antistatic layer and the release layer face each other;
surface resistance of the adhesive layer surface in contact with the release layer is greater than or equal to $10^9$ Ω/sq and less than or equal to $5 \times 10^{12}$ Ω/sq; and
the adhesive layer has a relative dielectric constant of 3.5 or greater under 100 kHz.

2. The optical film of claim 1, wherein the adhesive layer has a thickness of greater than or equal to 10 μm and less than or equal to 200 μm.

3. The optical film of claim 1, wherein the adhesive layer has a metal ion content of 50 ppm or less.

4. The optical film of claim 1, wherein the adhesive layer is a non-silicone-based adhesive layer.

5. The optical film of claim 1, wherein peel strength of the adhesive layer for glass measured at a peel angle of 180° and a peel rate of 0.3 m/min is greater than or equal to 0.5 gf/in and less than or equal to 15 gf/in.

6. The optical film of claim 1, wherein a wetting time of the adhesive layer for glass is from 1 second to 6 seconds.

7. An optical film comprising:
a base layer comprising a base film, a first antistatic layer and a second antistatic layer each provided on opposing surfaces of the base film; and an adhesive layer provided on a surface of the second antistatic layer opposite to the surface facing the base film;

wherein peel strength of the adhesive layer for glass measured at a peel angle of 180° and a peel rate of 0.3 m/min is greater than or equal to 0.5 gf/in and less than or equal to 15 gf/in;

wherein the adhesive layer has surface resistance of greater than or equal to $10^9$ Ω/sq and less than or equal to $5×10^{12}$ Ω/sq; and the adhesive layer has a relative dielectric constant of 3.5 or greater under 100 kHz.

8. The optical film of claim 7, wherein a wetting time of the adhesive layer for glass is from 1 second to 6 seconds.

9. A method for preparing an optical film comprising:

forming a base layer comprising a base film, a first antistatic layer and a second antistatic layer each provided on opposing surfaces of the base film;

forming a protective layer comprising a protective film, a third antistatic layer and a fourth antistatic layer each provided on opposing surfaces of the protective film, and a release layer provided on a surface opposite to the surface facing the protective film of the third antistatic layer; and bonding the base layer and the protective layer by an adhesive layer so that the second antistatic layer and the release layer face each other, wherein surface resistance of the adhesive layer surface in contact with the release layer is greater than or equal to $10^9$ Ω/sq and less than or equal to $5×10^{12}$ Ω/sq; and the adhesive layer has a relative dielectric constant of 3.5 or greater under 100 kHz.

10. A method for manufacturing an organic light emitting electronic device comprising:

removing the protective layer from the optical film of claim 1; and attaching the adhesive layer of the optical film on an encapsulation layer of an organic light emitting device.

11. The method for manufacturing an organic light emitting electronic device of claim 10, wherein the organic light emitting device comprises a back plate, a plastic substrate, a thin film transistor, an organic light emitting diode and an encapsulation layer, in a consecutive order.

12. The method for manufacturing an organic light emitting electronic device of claim 10, further comprising:

peeling the optical film from the encapsulation layer; and laminating a touch screen panel and a cover window on the encapsulation layer.

\* \* \* \* \*